(12) United States Patent
Antol et al.

(10) Patent No.: US 8,183,698 B2
(45) Date of Patent: May 22, 2012

(54) BOND PAD SUPPORT STRUCTURE FOR SEMICONDUCTOR DEVICE

(75) Inventors: Joze E. Antol, Hamburg, PA (US); John W. Osenbach, Kutztown, PA (US); Kurt G. Steiner, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 161 days.

(21) Appl. No.: 12/678,405

(22) PCT Filed: Oct. 31, 2007

(86) PCT No.: PCT/US2007/083183
§ 371 (c)(1),
(2), (4) Date: Mar. 16, 2010

(87) PCT Pub. No.: WO2009/058143
PCT Pub. Date: May 7, 2009

(65) Prior Publication Data
US 2010/0201000 A1    Aug. 12, 2010

(51) Int. Cl.
*H01L 23/12* (2006.01)
*H01L 23/48* (2006.01)

(52) U.S. Cl. ........ 257/780; 257/750; 257/758; 257/773; 257/776; 257/784; 257/E23.019; 257/E23.151

(58) Field of Classification Search .................. 257/750, 257/758, 773, 776, 780–782, 784, E23.019, 257/E23.151
See application file for complete search history.

(56) References Cited

U.S. PATENT DOCUMENTS 5,106,461 A    4/1992   Volfson et al.
5,128,737 A    7/1992   van der Have
(Continued)

FOREIGN PATENT DOCUMENTS
JP    2004207509 A    7/2004
(Continued)

OTHER PUBLICATIONS

Antol et al., "Bond Pad Support Structure for Semiconductor Device," PCT/US2007/083183 International Search Report and Written Opinion, Jul. 18, 2008, PCT Publication No. WO 2009/058143 (14 pages).

(Continued)

*Primary Examiner* — Jasmine Clark
(74) *Attorney, Agent, or Firm* — Mendelsohn, Drucker & Associates, P.C.; Edward J. Meisarosh; Steve Mendelsohn

(57) ABSTRACT

According to certain embodiments, integrated circuits are fabricated using brittle low-k dielectric material to reduce undesired capacitances between conductive structures. To avoid permanent damage to such dielectric material, bond pads are fabricated with support structures that shield the dielectric material from destructive forces during wire bonding. In one implementation, the support structure includes a passivation structure between the bond pad and the topmost metallization layer. In another implementation, the support structure includes metal features between the topmost metallization layer and the next-topmost metallization layer. In both cases, the region of the next-topmost metallization layer under the bond pad can have multiple metal lines corresponding to different signal routing paths. As such, restrictions on the use of the next-topmost metallization layer for routing purposes are reduced compared to prior-art bond-pad support structures that require the region of the next-topmost metallization layer under the bond pad to be a single metal structure.

20 Claims, 3 Drawing Sheets

U.S. PATENT DOCUMENTS

| | | | |
|---|---|---|---|
| 5,248,903 A | 9/1993 | Heim | |
| 5,302,550 A | 4/1994 | Hirota et al. | |
| 5,656,858 A | 8/1997 | Kondo et al. | |
| 5,659,201 A | 8/1997 | Wollesen | |
| 5,686,762 A | 11/1997 | Langley | |
| 5,751,065 A | 5/1998 | Chittipeddi et al. | |
| 5,854,514 A | 12/1998 | Roldan et al. | |
| 5,933,715 A | 8/1999 | Igel et al. | |
| 6,037,664 A | 3/2000 | Zhao et al. | |
| 6,187,680 B1 | 2/2001 | Costrini et al. | |
| 6,198,170 B1 | 3/2001 | Zhao | |
| 6,222,270 B1 | 4/2001 | Lee | |
| 6,306,750 B1 | 10/2001 | Huang et al. | |
| 6,350,705 B1 | 2/2002 | Lin | |
| 6,358,831 B1 | 3/2002 | Liu et al. | |
| 6,400,021 B1 | 6/2002 | Cho | |
| 6,426,556 B1 | 7/2002 | Lin | |
| 6,440,833 B1 | 8/2002 | Lee et al. | |
| 6,500,748 B2 | 12/2002 | Anand | |
| 6,531,384 B1 | 3/2003 | Kobayashi et al. | |
| 6,563,216 B1 | 5/2003 | Kimura et al. | |
| 6,596,622 B2 | 7/2003 | Okada | |
| 6,620,720 B1 | 9/2003 | Moyer et al. | |
| 6,642,597 B1 | 11/2003 | Burke et al. | |
| 6,664,578 B2 | 12/2003 | Lee et al. | |
| 6,689,680 B2 | 2/2004 | Greer | |
| 6,717,270 B1 | 4/2004 | Downey et al. | |
| 6,743,979 B1 | 6/2004 | Berman et al. | |
| 6,798,035 B1 | 9/2004 | Low et al. | |
| 6,803,302 B2 | 10/2004 | Pozder et al. | |
| 6,825,563 B1 | 11/2004 | Ranganathan et al. | |
| 6,841,872 B1 | 1/2005 | Ha et al. | |
| 7,005,369 B2 | 2/2006 | Gasner et al. | |
| 7,015,129 B2 | 3/2006 | Lai et al. | |
| 7,049,170 B2 | 5/2006 | Savastiouk et al. | |
| 7,160,805 B1 | 1/2007 | Burke et al. | |
| 7,233,075 B2 | 6/2007 | Hung et al. | |
| 7,242,099 B2 | 7/2007 | Lin et al. | |
| 7,273,804 B2 | 9/2007 | Angell et al. | |
| 7,301,231 B2 | 11/2007 | Antol et al. | |
| 7,328,830 B2 | 2/2008 | Bachman et al. | |
| 7,364,998 B2 | 4/2008 | Chiu et al. | |
| 7,535,114 B2 | 5/2009 | Agraharam et al. | |
| 7,592,710 B2 * | 9/2009 | Hsia et al. | 257/786 |
| 2001/0051426 A1 | 12/2001 | Pozder et al. | |
| 2003/0127502 A1 | 7/2003 | Alvarez | |
| 2003/0173637 A1 | 9/2003 | Downey et al. | |
| 2003/0173667 A1 | 9/2003 | Yong et al. | |
| 2003/0189249 A1 | 10/2003 | Tong et al. | |
| 2003/0222348 A1 | 12/2003 | Okada | |
| 2004/0134974 A1 | 7/2004 | Oh et al. | |
| 2004/0201101 A1 | 10/2004 | Kang et al. | |
| 2006/0006552 A1 | 1/2006 | Kang et al. | |
| 2006/0289974 A1 | 12/2006 | Saran et al. | |
| 2008/0093596 A1 | 4/2008 | Shin et al. | |
| 2008/0233733 A1 | 9/2008 | Lin | |
| 2008/0272487 A1 | 11/2008 | Shim et al. | |
| 2009/0015285 A1 | 1/2009 | Farooq et al. | |
| 2009/0079082 A1 | 3/2009 | Liu et al. | |
| 2010/0019395 A1 * | 1/2010 | Zecri | 257/782 |

FOREIGN PATENT DOCUMENTS

| | | |
|---|---|---|
| JP | 2007227815 A | 9/2007 |
| WO | 2009058143 A1 | 5/2009 |

OTHER PUBLICATIONS

European Examination Report; Mailed May 30, 2011 for corresponding European Application No. 07 854 541.5.

* cited by examiner

BOND PAD SUPPORT STRUCTURE FOR SEMICONDUCTOR DEVICE

FIELD OF THE INVENTION

The present invention relates to bond pads for integrated circuit dies, and in particular to the metallization layers supporting a bond pad.

DESCRIPTION OF THE RELATED ART

The manufacture of a semiconductor device is a multi-step process that includes a wafer-fabrication step and an assembly step. Wafer fabrication includes adding layers of precisely-formed materials on a semiconductor substrate. The layers are patterned by photo-masking and etching. Typically, the topmost layers include several metallization layers that contain metal lines connecting various components on lower layers. Direct connections between metal layers are accomplished using metal vias, i.e., vertical lines, between metal layers. Wafer fabrication produces a wafer that comprises multiple integrated circuits (ICs). Assembly typically includes (i) cutting the wafer into individual IC dies, (ii) attaching each die to a corresponding lead frame, (iii) wire bonding pads on each die to leads on the corresponding lead frame, and (iv) encapsulating each die, bond wires, and corresponding lead frame in a plastic or ceramic package. Alternative assembly processes are used for particular chip types. For example, assembly of ball grid array (BGA) type chips typically involves the electrical connection of the die to a non-lead-frame base, referred to as a substrate, that provides electrical connectivity to a circuit board, and encapsulation in a polymer material.

Engineering advances over time lead to reductions in the size of the components in ICs along with increases in the operational clock speeds of the ICs. The reduction in size and increase in speed introduce new challenges. Parasitic capacitive coupling between elements, e.g., metal lines, increases as element device dimensions decrease and its effects can be magnified at higher operating frequencies. The capacitive coupling increases because the capacitance between two elements is inversely-proportional to the distance between them. This relationship can be seen from the formula for C, the capacitance of a parallel-plate capacitor, wherein the capacitance can be represented as:

$$C = \frac{\varepsilon_0 k A}{d} \quad (1)$$

wherein $\varepsilon_0$ is the permittivity of vacuum, k is the dielectric constant of the dielectric, i.e., the material separating the capacitor plates, A is the area of each of the plates, and d is the distance between the plates.

Metal lines in an IC are typically separated by silicon dioxide ($SiO_2$), whose dielectric constant k is approximately 4.3. Reducing the dielectric constant would operate to reduce the capacitance between two elements, as can be seen from equation (1). Techniques have been developed to fabricate ICs with low-k dielectrics. Dielectric materials having a k below approximately 3.0 are considered low-k dielectrics. Low-k dielectrics can be formed, for example, by introducing hollow spaces, i.e., porosity, and/or impurities, e.g., certain hydrocarbons, into regular $SiO_2$ dielectric material.

Low-k $SiO_2$ dielectrics tend to be structurally weaker than regular $SiO_2$. The relative weakness is exemplified, e.g., by having a lower elastic modulus. For example, a piece of regular $SiO_2$ can have a Young's modulus of between 50 and 150 GPa, depending on the technique used to fabricate it, while a corresponding piece of a low-k dielectric can have a Young's modulus of less than 20 GPa. Weaker dielectrics are more easily damaged and are more likely to suffer destructive fractures during assembly, e.g., during the wire bonding process when a wire is attached to a bond pad on the die. The attachment of a wire to a bond pad generally includes the application of pressure, ultrasonic energy, and/or heat, which impose mechanical stress onto the bond pad as well as the structure underneath the bond pad. This mechanical stress can potentially damage those underlying structures. The likelihood of damage increases as the strength of the bond pad and underlying structure decreases. In addition, since the mechanical stress on a bond pad is inversely proportional to the area of the bond pad, the likelihood of damage increases as the silicon technology dimensions, and consequently, the bond pad sizes, decrease.

FIG. 1 shows a cross-sectional view of a bond pad area of semiconductor device 100 in accordance with U.S. Pat. No. 7,115,985 B2 ("the '985 patent") issued to Antol et al., which describes one prior-art reinforced bond pad that helps reduce damage to device components subjacent to the bonding pad. Semiconductor device 100 comprises substrate 101 at the bottom. Overlaying substrate 101 are seven metallization layers M1-M7. The metallization layers comprise metallic lines that are routed to connect components on substrate 101. The metallic lines and metallization layers are separated by dielectric 102. Select metallic lines in adjoining metallization layers are directly connected by metallic vias such as via 103.

Topmost metal layer M7 is partially overlaid with first passivation layer 104, which has an opening, or window, to allow the formation of bond pad 105 using, e.g., aluminum. Passivation layers can be made of, e.g., silicon nitride ($Si_3N_4$). Bond pad 105 is conductively connected to a portion of metallization layer M7, and, via the other metallization layers and intermediary vias, to one or more appropriate components on substrate 101. Exposed areas of first passivation layer 104 and the perimeter of bond pad 105 are topped by second passivation layer 106. In the volume substantially beneath bond pad 105, metal layers M6 and M7 are substantially continuous planar structures interconnected by an array of metal-filled recesses arranged to intersect one another to form a mesh-like pattern containing a plurality of discrete sections of dielectric 102. This two-layer array-interconnected metallic structure underneath bond pad 105 provides (i) structural reinforcement to the volume underneath bond pad 105, as well as (ii) a conductive path from bond pad 105 to appropriate components on substrate 101.

Because of the substantially-planar natures of, and the mesh of metallic interconnects between, the sections of metal layers M6 and M7 underneath bond pad 105, those areas of metal layers M6 and M7 have comprehensive routing restrictions and are largely unusable for routing regular metal lines for component interconnection.

SUMMARY OF THE INVENTION

In one embodiment, the invention can be an integrated circuit (IC) comprising: (i) a bond pad, (ii) a passivation structure directly underneath and in direct contact with a portion of the bond pad, and (iii) a first metallization layer under the bond pad and the passivation structure, wherein an other portion of the bond pad is in direct contact with the first metallization layer.

In another embodiment, the invention can be an integrated circuit (IC) comprising: (i) a bond pad, (ii) a first metallization layer under and in direct contact with the bond pad, (iii) a second metallization layer under the first metallization layer, and (iv) first low-k dielectric material between the first and second metallization layers. A portion of the second metallization layer under the bond pad comprises two or more metal lines that are (i) part of two more distinct routing paths in the IC and (ii) separated by second low-k dielectric material. At least one of the metal lines in the portion of the second metallization layer under the bond pad is directly connected to the first metallization layer by one or more metal features in the first low-k dielectric material. At least one of the metal lines in the portion of the second metallization layer under the bond pad is not directly connected to the first metallization layer by any metal feature in the first low-k dielectric material.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 2:
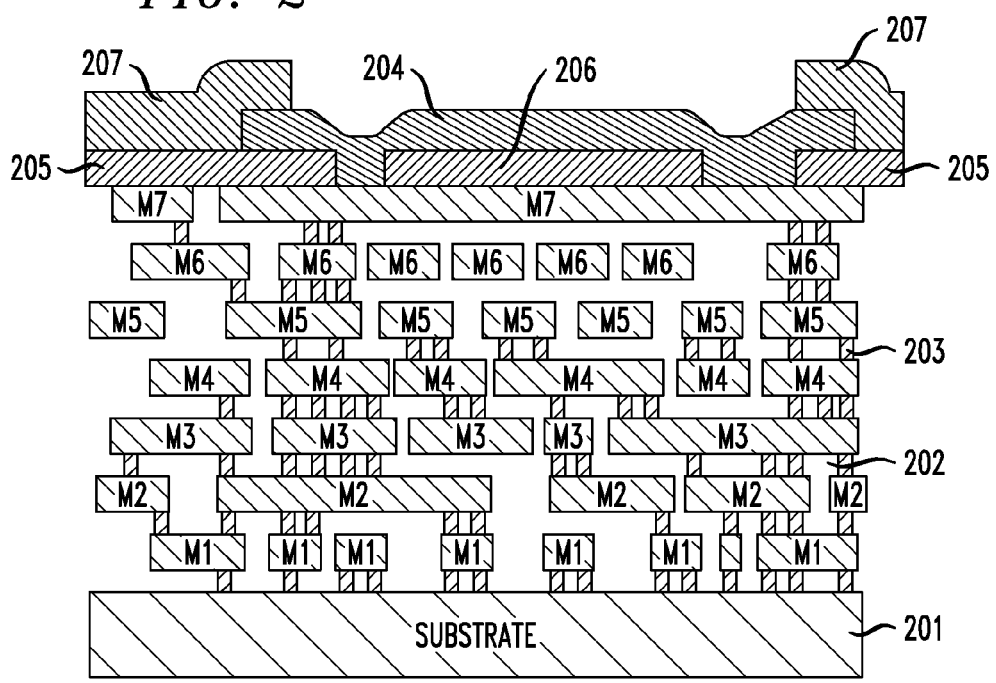
FIG. 2 shows a cross-sectional view of a semiconductor-device bond pad in accordance with an embodiment of the present invention.

FIG. 2 shows a cross-sectional view of a section of semiconductor device 200 corresponding to bond pad 204. Semiconductor device 200 comprises substrate 201 at the bottom. Overlaying substrate 201 are seven metallization layers M1-M7. The metallization layers comprise metallic lines that are routed to connect components on substrate 201. The metallic lines and metallization layers are separated by dielectric 202. Particular metallic lines in adjoining metallization layers are directly connected by metallic vias such as via 203.

Topmost metal layer M7 is partially overlaid with first passivation layer 205, which has an opening to allow the formation of bond pad 204 using, e.g., aluminum. The opening for bond pad 204 in first passivation layer 205 is a frame or outline opening, i.e., only a framing part is removed from the first passivation layer 205 section that is coincident with bond pad 204, thereby, leaving behind passivation structure 206. Bond pad 204 is conductively connected to a portion of metallization layer M7, and, via the other metallization layers and intermediary vias, to one or more appropriate components on substrate 201. Exposed areas of first passivation layer 205 and the perimeter of bond pad 204 are topped by second passivation layer 207. In the volume substantially beneath bond pad 204, metal layer M7 is substantially a continuous planar structure, while metal layers M1-M6 in that volume comprise routed metal lines, as metal layers M1-M6 generally do in other areas. Specifically, the portion of metallization layer M6 underneath bond pad 204 comprises two or more metal lines that are parts of distinct routing paths in semiconductor device 200. Distinct routing paths are not directly connected, but may be coupled through other components.

Figure 1:
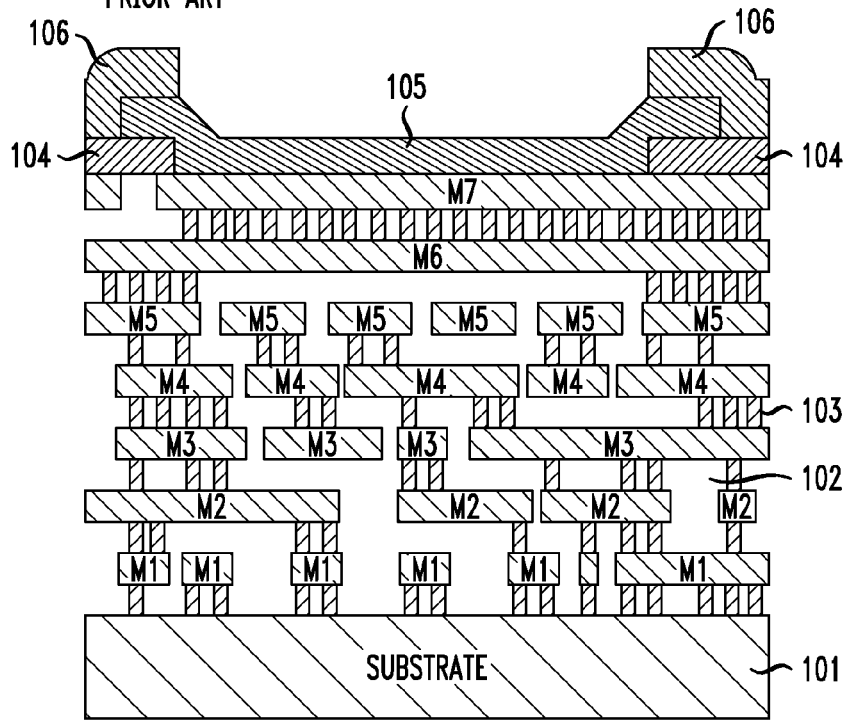
FIG. 1 shows a cross-sectional view of a bond pad of a prior-art semiconductor device.

Passivation structure 206 and the substantially-continuous planar portion of metallization layer M7 underneath bond pad 204 provide structural support for the area of semiconductor device 200 underneath bond pad 204. During wire bonding, passivation structure 206 helps mitigate the stresses from the bonding process on the underlying volume. The area of metallization layer M6 substantially underneath bond pad 204 is not a substantially-continuous planar structure and does not have the comprehensive routing restrictions of the corresponding section of metallization layer M6 of FIG. 1, i.e., that area as well as the rest of metallization layer M6 are not subject to any routing restrictions directly related to the location of bond pad 204. Rather, that area can be used to route metal lines, which allows for more efficient utilization of the volume substantially underneath bond pad 204.

Figure 3:
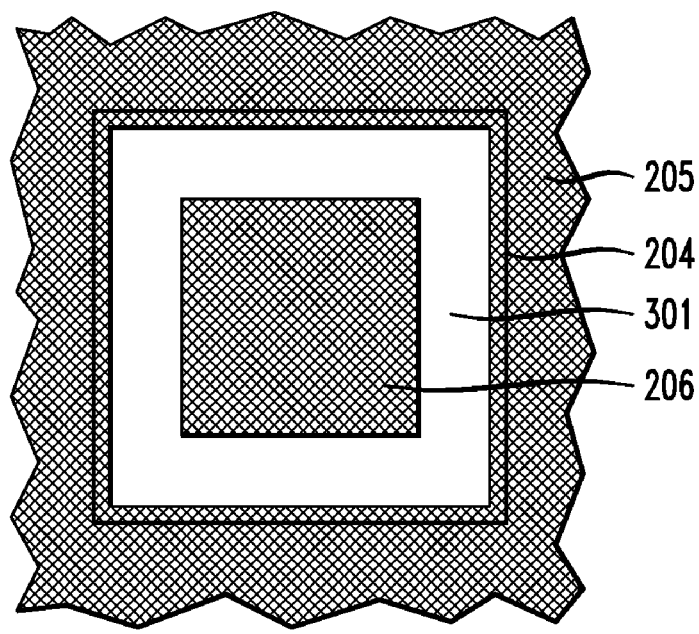
FIG. 3 shows a cutaway top view of one implementation of the bond pad of FIG. 2.

FIG. 3 shows a cutaway top view of one implementation of the bond pad section of FIG. 2. First passivation layer 205 and passivation structure 206 are shown using a diagonal cross-hatch pattern. It should be noted that passivation layer 205 extends beyond the area shown in FIG. 3. Bond pad 204 is substantially square in shape. Passivation structure 206 is substantially (i) centered within the area of bond pad 204 and (ii) square in shape. Exemplary dimensions for bond pad 204 and passivation structure 206 are 60×60 μm and 40×40 μm, respectively. Interface region 301, shown in white, is the area between passivation structure 206 and first passivation layer 205. Interface region 301 provides electrical connectivity for bond pad 204 to topmost metallization layer M7 of FIG. 2.

Figure 4:
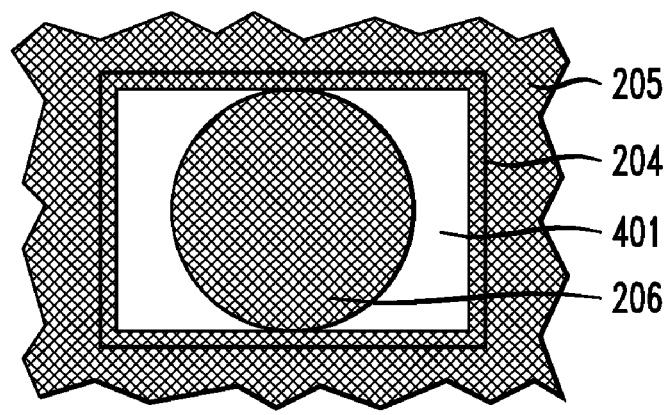
FIG. 4 shows a cutaway top view of another implementation of the bond pad of FIG. 2.

FIG. 4 shows a cutaway top view of an alternative implementation of the bond pad section of FIG. 2. First passivation layer 205 and passivation structure 206 are shown using a diagonal cross-hatch pattern, wherein passivation layer 205 extends beyond the area shown. Bond pad 204 is substantially rectangular. Passivation structure 206 is substantially (i) centered within the area of bond pad 204 and (ii) circular in shape. Note that circle is a particular type of ellipse. Exemplary dimensions for bond pad 204 and passivation structure 206 are 60×40 μm and 40 μm diameter, respectively. Interface region 401, shown in white, is the area between passivation structure 206 and first passivation layer 205. Interface region 401 provides electrical connectivity for bond pad 204 to topmost metallization layer M7 of FIG. 2.

Figure 5:
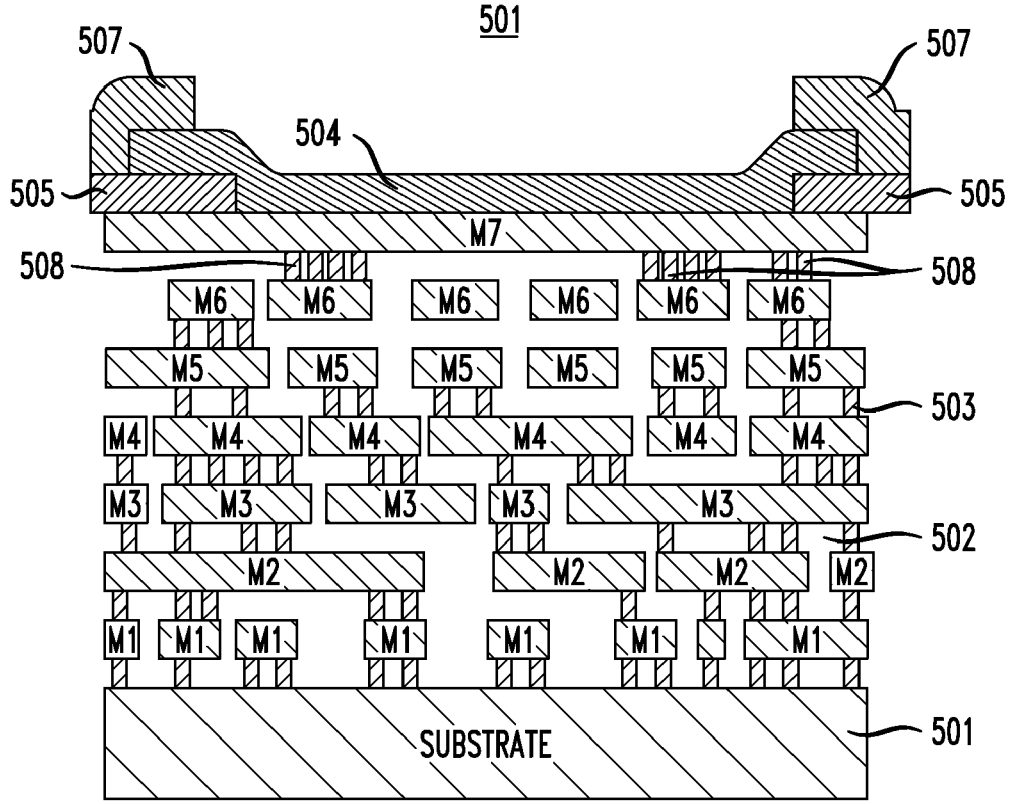
FIG. 5 shows a cross-sectional view of a semiconductor-device bond pad in accordance with another embodiment of the present invention.

FIG. 5 shows a cross-sectional view of a bond pad of semiconductor device 500, in accordance with another embodiment of the present invention. Elements in FIG. 5 that are substantially similar to elements in FIG. 2 have been similarly numbered, but with a different prefix. Bond pad 504 of semiconductor device 500 does not include a passivation structure analogous to passivation structure 206 of FIG. 2. Rather, structural reinforcement is provided using supporting vias, such as vias 508, between metallization layers M6 and M7. The area of metallization layer M6 underneath bond pad 504 is partially routing restricted, wherein some parts can be used for routing metal lines, while other parts comprise dedicated metal lines connected to metallization layer M7 to provide structural support to bond pad 504. It should be noted that the dedicated metal lines can nevertheless be used as part of a conductive path connecting bond pad 504 to appropriate components on substrate 501.

Figure 6:
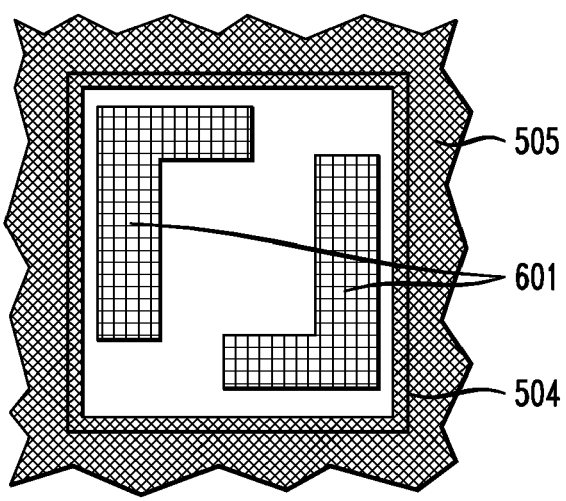
FIG. 6 shows a cutaway top view of one implementation of the bond pad of FIG. 5.

FIG. 6 shows a cutaway top view of one implementation of the bond pad section of FIG. 5. First passivation layer 505 is shown using a diagonal cross-hatch pattern, wherein passivation layer 505 extends beyond the area shown. Bond pad 504 is substantially square. Routing-restricted areas 601 of metallization layer M6 correspond to structural-support vias, such as vias 508 of FIG. 5, and are shown using an orthogonal cross-hatch pattern. Routing-restricted areas 601 of FIG. 6 form a partial frame and are substantially symmetrical about the center of bond pad 504.

In an alternative implementation of the bond pad section of FIG. 5, routing-restricted areas 601 of metallization layer M6 and the corresponding structure-supporting vias form a shape other than that shown in FIG. 6. The fill density for the vias between metallization layers M6 and M7, i.e., the percentage of the top-view cross-sectional area that is metal vias, in the area underneath bond pad 504 should be at least 30%, with a preferred fill density of approximately 60-80%. The fill density can be achieved either by particular routing of the dedicated metal lines of metallization layer M6 or by use of a particular fill pattern for the interconnecting metal features.

In an alternative embodiment of bond pad 204 of FIG. 4, passivation structure 206 has a diameter lesser than the smaller dimension of bond pad 204. In an alternative implementation of bond pad 204 of FIG. 2, passivation structure 206 is in the shape of a non-circular ellipse. In an alternative implementation of bond pad 204 of FIG. 2, passivation structure 206 is a shape other than a square or an ellipse. In designing a specific shape for passivation structure 206, factors to be considered include design rules for the semiconductor device, the need to maximize the area of the passivation structure to provide maximal structural support, and the need to maximize the contact area to provide maximal signal transmittal from bond pad to topmost metallization layer.

In one alternative implementation of semiconductor device 200 of FIG. 2, there are no metal vias between metallization layers M6 and M7 in the volume underneath bond pad 204.

Embodiments of semiconductor devices have been described having seven metallization layers. That number is exemplary. As would be appreciated by one of ordinary skill in the art, alternative embodiments can have different numbers of metallization layers, as determined by the designer of the particular semiconductor device.

Embodiments of semiconductor devices have been described employing a second passivation layer. An alternative embodiment has only the first passivation layer. Another alternative embodiment has three or more passivation layers.

Some integrated circuits comprise one or more metal structures having a bond pad directly connected to a probe region. As used in this specification, the term "bond pad" does not include the probe region of such a metal structure.

In one alternative implementation of semiconductor device 200 of FIG. 2, the routing-restricted portion of metallization layer M7 that forms a contact structure with bond pad 204 is shaped substantially similar to the interface region, such as interface region 301 of FIG. 3 or interface region 401 of FIG. 4. Thus, some of the area of metallization layer M7 that is underneath the passivation structure can be used for routing metal lines. For example, in one implementation, the area of metallization layer M7 that corresponds to passivation structure 206 of FIG. 3 can be used for regular routing of metal lines.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

We claim:

1. An integrated circuit (IC) comprising:
   a bond pad;
   a first passivation structure directly underneath and in direct contact with a first portion of the bond pad; and
   a first metallization layer under the bond pad and the first passivation structure, wherein the first metallization layer comprises a first metal structure directly underneath and in direct contact with both (i) a second portion of the bond pad and (ii) the first passivation structure;
   a second metallization layer under the first metallization layer; and
   dielectric material between the first and second metallization layers, wherein a portion of the second metallization layer directly underneath the bond pad comprises two or more metal structures corresponding to two or more distinct routing paths.

2. The invention of claim 1, wherein the first metallization layer comprises one or more distinct routing paths not below the bond pad and not directly connected to the first metal structure.

3. The invention of claim 1, wherein the first metallization layer does not have more than one distinct routing path under the bond pad.

4. The invention of claim 1, wherein the dielectric material is low-k dielectric material.

5. The invention of claim 4, wherein the low-k dielectric materials have a dielectric constant k of less than 3.

6. The invention of claim 4, wherein the low-k dielectric materials have a Young's modulus of less than 40 GPa.

7. The invention of claim 1, wherein there are no metal vias between the first and second metallization layers in the volume underneath the bond pad.

8. The invention of claim 1, wherein the bond pad is part of a larger structure that also includes a probe region directly connected to the bond pad.

9. The IC of claim 1, wherein the first passivation structure helps prevent permanent damage to the IC during wire-bonding to the bond pad.

10. The invention of claim 1, wherein the first metal structure is a substantially continuous planar metal structure having substantially the same area as the bond pad, located underneath and directly connected to the bond pad.

11. The invention of claim 1, further comprising a second passivation structure above the first metallization layer.

12. The invention of claim 11, wherein the second passivation structure is separated from the first passivation structure by the second portion of the bond pad that is in direct contact with the first metallization layer.

13. The invention of claim 12, wherein the first passivation structure is substantially in the shape of a square substantially centered in an opening in the second passivation structure.

14. The invention of claim 12, wherein the first passivation structure is substantially in the shape of an ellipse substantially centered in an opening in the second passivation structure.

15. The invention of claim 11, wherein the first passivation structure and the second passivation structure are made of substantially identical passivation material.

16. An integrated circuit (IC) comprising:
a bond pad;
a first metallization layer under and in direct contact with the bond pad;
a second metallization layer under the first metallization layer;
low-k dielectric material between the first and second metallization layers, wherein: a portion of the second metallization layer under the bond pad comprises two or more metal lines that are (i) part of two more distinct routing paths in the IC and (ii) separated by low-k dielectric material;
at least one of the metal lines in the portion of the second metallization layer under the bond pad is directly connected to the first metallization layer by one or more metal features in the low-k dielectric material; and
at least one of the metal lines in the portion of the second metallization layer under the bond pad is not directly connected to the first metallization layer by any metal feature in the first low-k dielectric material.

17. The invention of claim 16, wherein fill density of metal features in the low-k dielectric material between the first and second metallization layers in the volume underneath the bond pad is at least 30%.

18. The invention of claim 17, wherein the fill density of metal features in the low-k dielectric material between the first and second metallization layers in the volume underneath the bond pad is 60-80%.

19. The invention of claim 16, wherein the one or more metal features helps prevent permanent damage to the IC during wire-bonding to the bond pad.

20. The invention of claim 1, wherein the first passivation structure is located substantially at the center of the bond pad.

* * * * *